United States Patent [19]
Shukla et al.

[11] Patent Number: 5,397,518
[45] Date of Patent: Mar. 14, 1995

[54] PROCESS FOR FORMING CERAMIC PIXEL ARRAY AND PIXEL ARRAY FORMED THEREBY

[75] Inventors: Vishwa N. Shukla, North Attleboro, Mass.; Allan J. Siuzdak, Cumberland; Stanley J. Lukasiewicz, Rumford, both of R.I.

[73] Assignee: Texas Instruments Incorporated, Dallas, Tex.

[21] Appl. No.: 49,017

[22] Filed: Apr. 16, 1993

[51] Int. Cl.$^6$ ............................................. C04B 33/32
[52] U.S. Cl. ......................................... 264/59; 264/63
[58] Field of Search ..................................... 264/59, 63

[56] References Cited

U.S. PATENT DOCUMENTS 4,806,295  2/1989  Trickett ............................... 264/59

FOREIGN PATENT DOCUMENTS

WO91/11307  8/1991  WIPO .

OTHER PUBLICATIONS

Deposition and Sintering of Particle Films on a Rigid Substrate by Terry J. Garino and Kent Bowen.
Photolithographic Patterning of Particulate Films by Terry J. Garino and Kent Brown.

Primary Examiner—James Derrington
Attorney, Agent, or Firm—Brian A. Carlson; James C. Kesterson; Richard L. Donaldson

[57] ABSTRACT

An array of raised lands disposed in columns and rows formed of ceramic material, particularly barium strontium titanate, is formed by making a die of resist material having a negative image pattern of the array on a ceramic substrate and then forming a slurry having a high solid content of the ceramic material, filling the pattern with the slurry and firing the filled die to produce a sintered array of pixels. In a modified embodiment a pressing pad 18 of deformable ceramic tape is formed and pressed into the die after the die has been filled with slurry 16 in order to compact the material and wipe the ceramic material from the sidewalls 12. In another embodiment a ceramic tape of the type used for the pressing pad is pressed into the die and after a short time removed from the die with the pixel array formed in the tape which is then fired to sinter the array. In a modification of this embodiment that portion of the tape extending out of the die beyond the sidewalls 12 can be removed and the die then fired to form a pixel array which is confined essentially to vertical shrinkage upon firing.

18 Claims, 2 Drawing Sheets

PROCESS FOR FORMING CERAMIC PIXEL ARRAY AND PIXEL ARRAY FORMED THEREBY

This invention relates generally to ceramics and more specifically to processes for forming arrays of columns and rows of lands, or pixels, formed in selected ceramic materials and arrays formed by the processes.

BACKGROUND OF THE INVENTION

Ceramic forms of titanate compounds have many uses in electronics. For example, barium titanate doped with a rare earth, such as lanthanum, has unique properties relating to its electrical resistivity which dramatically increases at temperatures above an anomaly and is widely used, inter alia, as temperature sensors. Another titanate, barium strontium titanate has unique properties relating to its pyroelectric coefficient which varies relative to temperature and is useful in sensing thermal radiation. Typically, devices which use barium strontium titanate (BST) material as a thermal radiation sensor comprise an array of pixels which were previously formed on a substrate. Such an array includes regularly spaced grooves of a selected depth, e.g., 1–2 mils, which extend along an X axis and a Y axis with the grooves having a selected width, e.g., a half mil, so that the array has a large number of generally square, flat lands per unit area which may be in the order of thousand of pixels per square centimeter. The total area of such arrays can vary depending on their use from one which may only have very few pixels, even a single pixel, up to several square centimeters containing thousands of pixels.

As stated above, pixels formed of barium strontium titanate exhibit a change in pyroelectric coefficient when subjected to thermal radiation and with a dense array can generate signals which can be electronically processed into visual images corresponding to the sensed thermal radiation. However, for effective use the pixels need to be accurately formed preferably with a relatively flat top surface and precisely located on the substrate relative to one another.

The conventional method of forming pixel arrays in titanate ceramic materials utilize a laser to cut or burn the grooves in a substrate of the material, such as barium strontium titanate. While this procedure can provide the desired accurate formation and precise location, it is a time consuming and costly procedure, particularly where a large number of grooves are required.

SUMMARY OF THE INVENTION

In accordance with the present invention there are provided several embodiments for forming pixel arrays in titanate materials which are not only accurately formed and precisely located but are also formed in an economical manner.

Briefly, according to a first embodiment of the present invention, a suitable die or mask having an interstice for each pixel is formed of photoresist material on a polished wafer of the selected ceramic material. The interstices of the die are filled with a slurry of the selected ceramic material in a solvent having a solids content of at least approximately 35% by volume. After wiping off excess slurry material the wafer is fired to form an array of pixels with the photoresist die decomposing during the firing process.

According to a feature of a modified embodiment of the invention a pressing pad of flexible ceramic tape material, preferably the same selected ceramic material as that used to fill the interstices of the die, is placed over the die and pressed into the interstices to compact the material in each interstice and to wipe the sidewalls of the die forming the interstices. The pad is removed and the resulting structure is fired to form a sintered array of pixels having improved flat top surfaces.

In accordance with another embodiment of the invention, a die is made using photoresist material on a suitable substrate, the die having interstices for each pixel as in the previous embodiments. A flexible tape is formed using the selected ceramic material along with suitable binders and solvents for tape casting. The tape is allowed to dry and is then placed over and pressed into the die and held there under pressure for a short time and is then removed having the pixel array formed therein ready for sintering.

According to a feature of a modified embodiment, in order to obtain improved control of spacing among the pixels after firing, the die is formed on a fired ceramic substrate and once the tape is forced into the die with the interstices of the die occupied by the tape material, the remainder of the tape is removed by suitable means, such as wiping with a reactive liquid. Upon firing the sintered pixel array will be formed on the substrate as in the first described embodiment with the horizontal component of shrinkage in effect being obviated.

Various additional objects and advantages of the present invention will become apparent from the following detailed description and accompanying drawings.

DESCRIPTION OF PREFERRED EMBODIMENTS

Figure 1:
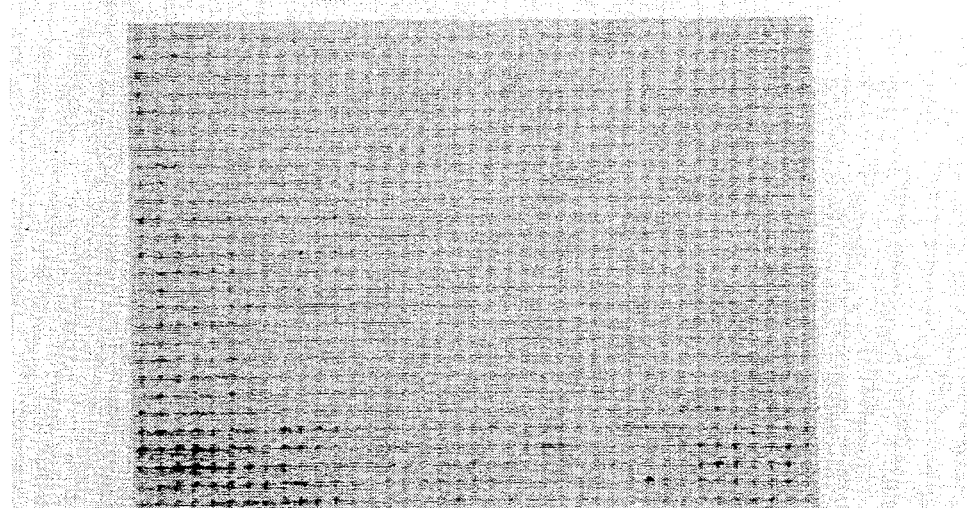
FIG. 1 is a photomicrograph enlarged 40 times of a die having a negative pattern for making an array of pixels in columns and rows formed of ceramic material.

In accordance with a first embodiment of the invention, a die is formed on a polished substrate using suitable techniques, such as by photolithography. Conveniently, the substrate can be composed of the same ceramic material as that of the pixels. Although this invention can be used with various ceramics, barium strontium titanate has particular utility when formed in a pixel array, as mentioned supra. The substrate is cleaned using suitable cleaning material such as tetrachloroethylene and then heated to drive off solvents as well as to preheat the substrate for a following step of laminating thereon a photopolymer film such as a 2 mil Riston 1020 on a mylar substrate sold by E.I. DuPont DeNemours & Co. The assembly is again heated and the mylar strip is removed leaving a sticky surface which is then coated with a thin layer of a liquid negative resist material such as Olin Hunt #839506 diluted 50/50 with xylene. The assembly is then heated and placed in a photolithography tower and exposed to ultraviolet light through a photomask having the desired pattern. The unwanted resist material is then developed out with suitable developer material such as 111 trichloroethane. The remaining negative pattern is then dried and plasma cleaned.

Barium strontium titanate (BST) can be prepared by reacting tetraisopropyl titanate with lactic acid and water to form an aqueous solution of titanium lactate. Barium and strontium acetate and additional water are mixed with the titanium solution in the correct proportions to obtain a final solution containing all the ingredients, 10–15% by weight of BST. The common solution is directly calcined to form BST. This procedure follows the teaching of U.S. Pat. No. 3,637,531 assigned to the assignee of the present invention, to which reference may be had for further details. The resulting material is milled, for example, in a high energy mill such as a tungsten carbide Shatterbox mill sold by Spex Corporation until a powder having a small size in the order of a micron is obtained. It will be understood that other methods could also be used in producing the BST material but preferably the composition of the material should be closely controlled and of uniform small particle size to provide a dense, uniform material without occlusions, voids or the like suitable for a pixel array in which the pixels may have a top surface as small as 20–25 microns on edge.

A high solids content slurry of BST powder of at least 35–55 V% is prepared comprising BST powder, water, a dispersing agent such as Darvan C sold by R. T. Vanderbilt Co., Inc. and optionally may include a defoaming agent such as octanol sold by E.I. DuPont de Nemours and Co. The interstices of the die are filled with the viscous slurry pushing the material into the cells with a flexible element and the top of the die leveled using a brush or wiping with a sponge. The die is then fired at a temperature within the range of approximately 1300°–1500° C., for example 1400° C. for approximately 1 to 5 hours, for example 5 hours to form a sintered array of pixels on a substrate of BST material with the resist pattern decomposing during the firing cycle.

EXAMPLE

Dies were made by taking polished wafers of BST, cleaning the wafers by swabbing with a Q-tip moistened with tetrachloroethylene, scrubbing the surface and wiping with a dry swab. The wafers were then baked at 95° C. for ten minutes and then laminated with a 2 mil Riston 1020 film with a mylar strip by rolling the film onto the wafers with rolls heated to 240° F. with the wafers placed on a stainless steel tray. The Riston 1020 film and mylar were severed between the wafers leaving the Riston 1020 film extending beyond each wafer and the wafers were scraped from the tray with a blade. The separated wafers were placed on a perforated tray and baked at 95° C. for ten minutes. The wafers were inverted and trimmed of all excess resist film, then turned over again and the mylar layer removed leaving a sticky surface. The resist layer was then coated with a thin layer of 50–50 mixture of Olin Hunt #839506 negative resist and xylene by using a resist spinner and again baked at 95° C. for ten minutes. The wafers were then exposed to 3362 mw/cm$^2$ ultraviolet light through a photomask for 2.90 seconds. After five minutes the photoresist patterns were developed with 111 trichloroethane for 30–35 seconds with a spray nozzle located approximately two inches from the wafer followed by a flood and spray of isopropyl alcohol and then dried with nitrogen. The parts were then plasma cleaned to produce dies, one being shown in the photomicrograph shown in FIG. 1 which is enlarged forty times. Dies were formed having 0.003 inch centers as well as 0.002 inch centers. Dies having 1 and 4 mil resist layers were also formed using an appropriately modified exposure time for the ultraviolet light and developing time. A 1 mil thick layer requires 3153–3187 mw/cm$^2$ (2.69–2.74 seconds) and 17–20 seconds of developing time while a 4 mil thick layer requires 6162 mw/cm$^2$ (5.40 seconds) and 30 seconds to develop.

Figure 2:
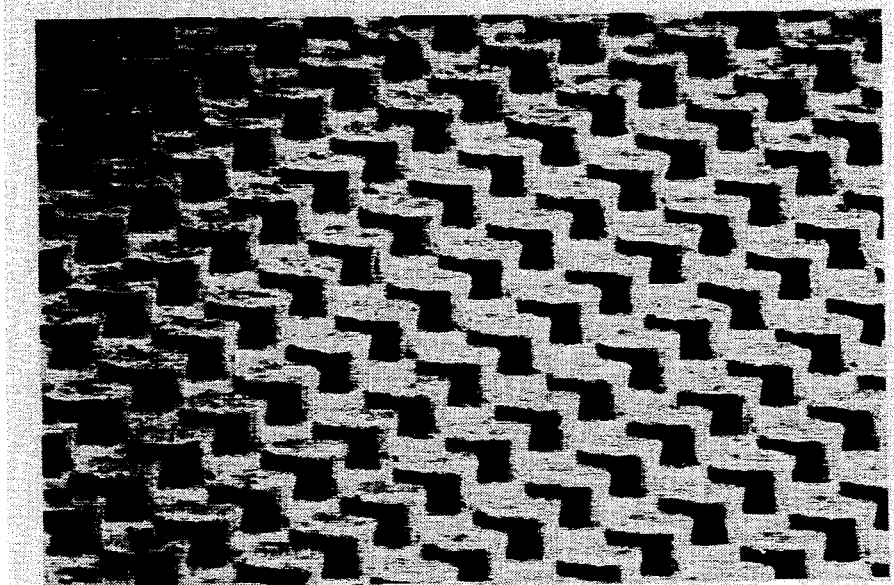
FIG. 2 is a photomicrograph enlarged 400 times of an array of ceramic pixels made in accordance with the first embodiment of the invention.

Slurries having from 35 to 50 V% solids were prepared by mixing BST power, water, 3–4 wt % Darvan C and less than 0.1 wt % octanol, in a ball mill with $\frac{1}{4}$ inch ZRO$_2$ media for at least 24 hours, the dies were filled with the slurry, wiped of excess material and fired at 1400° C. for 5 hours to sinter. An effective way of filling the cells of the pattern was to force the material into the cells by rubbing them with a finger. The addition of Darvan C to water makes the slurry more fluid and easier to work into the cells of the die while the octanol serves to lower the surface tension of the fluid. The specific amounts of Darvan C may vary depending upon the particular weight of the powder and typically is added one percent at a time until the proper fluid characteristics are achieved. Typically, the weight of Darvan is in the range of approximately 1–6%. FIG. 2 is a photomicrograph of an array made using 45 V% solids with a 1 mil thick resist on a polished BST substrate enlarged 400 times.

In a modified process a pressing pad was formed of BST material and placed on top of a die which had been filled with BST slurry as described above. The pad was forced down into the die so that the pad deformed into the individual interstices or cells effectively wiping the sidewalls of the cells and improving the flatness of the pixels by inhibiting the meniscus formation which would cause a concave top surface of the pixels.

A pressing pad was made by mixing:
  200 grams BST powder
  8 grams polyvinyl butyral (B-76 grade)
  0.4 grams dibutyl phthalate (DBP)
  4.6 grams polyethylene glycol(200)
  90 grams trichloroethylene—ethanol azeotrope (TCE-EA AZEO)
  2 grams glycerol trioleate (GTO)

The mixture, other than the polyvinyl butyral was milled at a fast rate for one hour and with the polyvinyl butyral was milled slowly overnight. The material was placed in a conventional reservoir container having an opening with a doctor blade disposed on a lower end thereof adjustable to provide openings of various heights so that a layer of material having a selected thickness can be deposited on a substrate when the substrate and reservoir container are moved relative to one another. The blade was positioned at 40 and 20 mil settings with the layers drying to 0.020 inches and 0.0075 inches respectively of easily deformable material.

Figure 3:
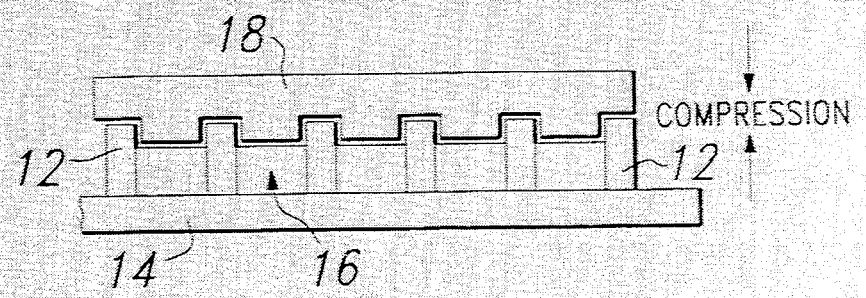
FIG. 3 is a cross sectional diagram of a die mounted on a wafer of ceramic material filled with a slurry of BST material and being compacted by a pressing pad formed of deformable BST material.
Figure 4:
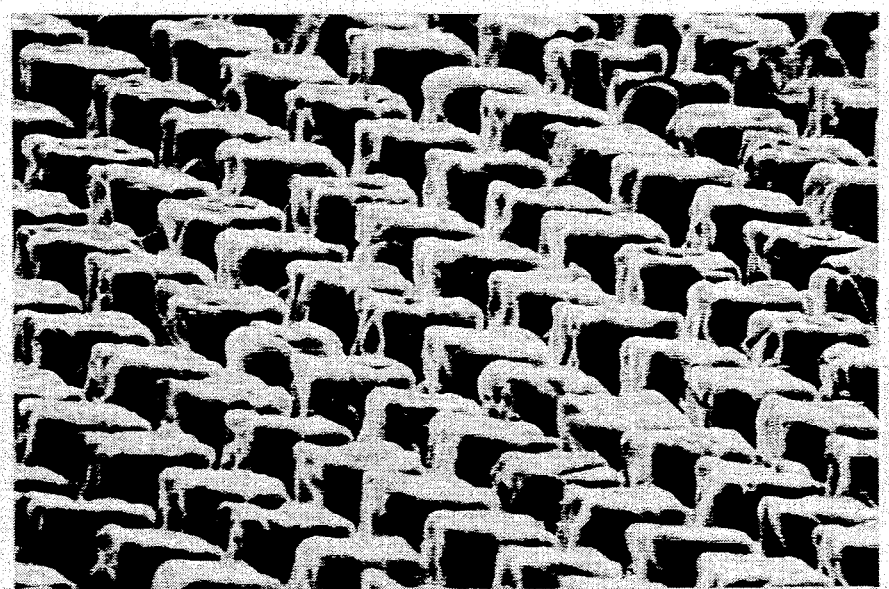
FIGS. 4 and 5 are photomicrographs enlarged 500 times of ceramic pixel arrays made using a pressing pad as shown in FIG. 3.
Figure 5:
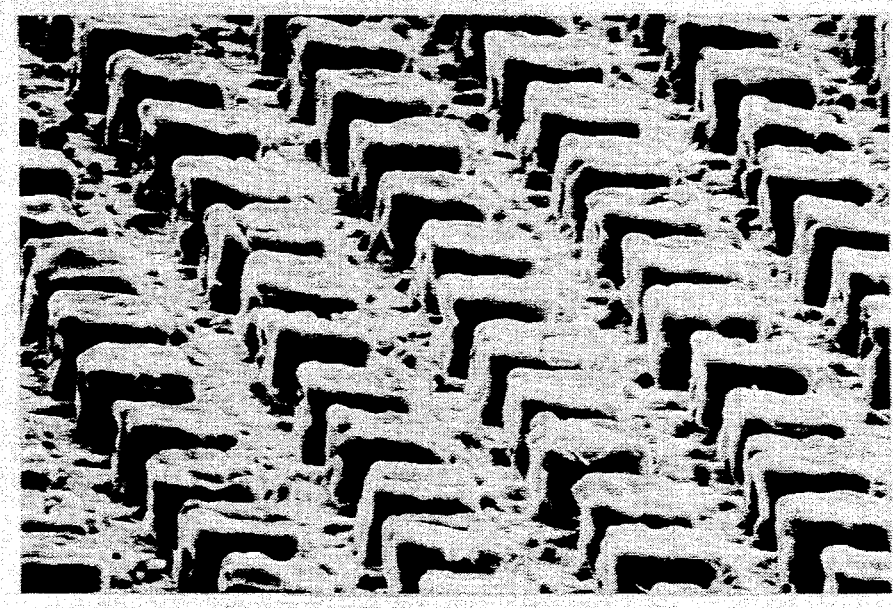

The unfired or green pressing pad was used to compress the material placed in the interstices of a die, as indicated in FIG. 3, which shows a pattern of resist material walls 12 on a polished wafer 14 of BST material with a thick slurry of BST material 16 received between the walls. Pressing pad 18 was placed over the die and pressed down onto the die with the pad deforming into the cells wiping the walls and consolidating the material within the cells. The filling, leveling and tape consolidation was repeated as necessary and then the wafer fired to form an array of pixels. As seen in the photomicrograph of FIGS. 4 and 5 the resulting pixels have a substantially flat top surface.

The above processes are particularly effective in maintaining very precise dimensional control among the pixels relative to one another because the shrinkage of the BST material upon firing is effectively limited to a vertical direction since the die is mounted on a previously fired BST wafer.

Figure 6:
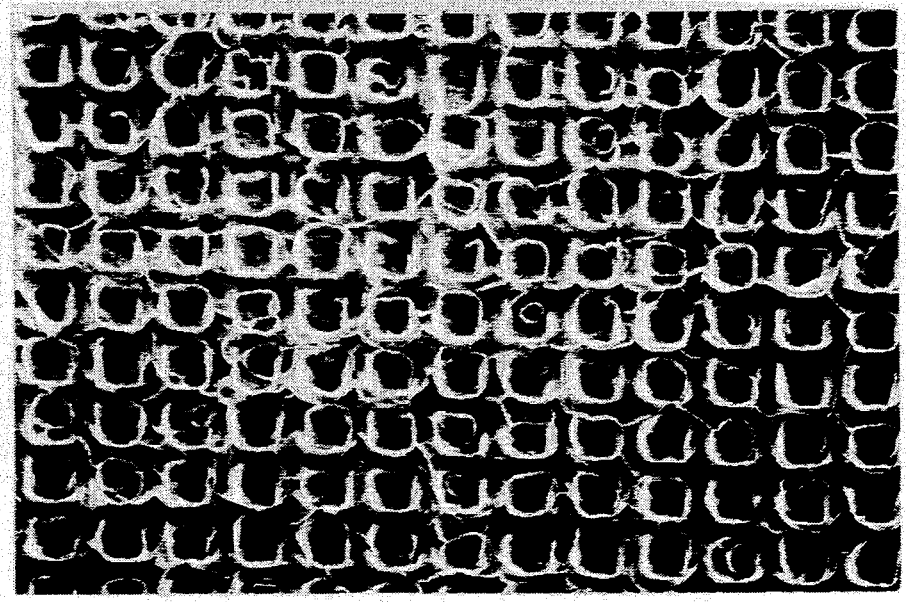
FIG. 6 is a photomicrograph enlarged 200 times of a ceramic pixel array made in accordance with another embodiment of the invention.

When such precise dimensional control is not required the array can be produced by forming a tape of the type described for use as the pressing pad and placing it over a die, pressing the tape material into the die and holding it there under pressure for a selected short period of time, for example between 5 seconds and 1 minute. The tape is then removed from the die with a well defined pixel array. A sintered array formed by this process is shown in the photomicrograph of FIG. 6.

Dimensional control of the spacing among the pixels of the entire tape array can be enhanced by removing the tape material extending outside of the die beyond the sidewalls by grinding the green tape or by removing the excess material using a reactive liquid abrasion technique such as wiping with a sponge soaked with an appropriate solvent.

This structure, if desired, can be isostatically pressed after a slight vacuum is pulled to reduce trapped air and to increase the density of the material.

In accordance with any of the above embodiments, the pixels are further processed in making a sensor in a known manner involving placing a metallic coating on the top surface of each pixel. In one such process a filler material is then placed between the pixels to form a matrix to hold the pixels in their proper spaced orientation. The substrate is then removed as by grinding and the bottom, or ground surface of each is coated with a suitable metallic layer. The array can then be bonded to an integrated circuit in a selected alignment and finally the matrix removed, as by a dry etching process.

Although the invention has been described with respect to specific preferred embodiments thereof, variations and modifications will become apparent to those skilled in the art. It is therefore the intention that the appended claims be interpreted as broadly as possible in view of the prior art to include all such variations and modifications.

We claim:

1. A method for making an array of pixels from a first ceramic material comprising the steps of
   forming a negative image array pattern of photoresist material on a ceramic substrate, the pattern having a plurality of interstices spaced from one another by walls of photoresist material extending from the ceramic substrate to an outer distal portion,
   forming a slurry of ceramic powder of said first ceramic material in a liquid vehicle having a solids content, by volume, of approximately 35% or more,
   filling the interstices with the slurry,
   leveling the pattern to remove excess slurry,
   forming a deformable pressing pad of a second ceramic material,
   placing the pad over the filled pattern,
   pressing the pad into the interstices thereby wiping the outer distal portions of the photoresist walls, and
   firing the substrate to decompose said photoresist material, and to form a sintered array of ceramic pixels.

2. A method according to claim 1 in which the first ceramic material is barium strontium titanate.

3. A method according to claim 1 in which the slurry has a solids content, by volume, within the range of approximately at least 45–55%.

4. A method according to claim 1 in which the slurry has a solid content, by volume, of approximately 45%.

5. A method according to claim 1 in which the slurry has a solid content, by volume, of approximately 50%.

6. A method according to claim 1 in which the photoresist walls are at least approximately 1 mil in height.

7. A method for making an array of pixels from ceramic material comprising the steps of
   forming a negative image array pattern of photoresist material on a substrate, the pattern having a plurality of interstices spaced from one another by walls of photoresist material extending from the substrate to an outer distal portion,
   forming a tape of deformable ceramic material using binders and solvents for tape casting,
   placing the tape over the pattern and pressing the tape into the interstices to form a pixel array in the tape, and
   firing the tape to decompose said photoresist material, and to form a sintered array of pixels.

8. A method according to claim 7 in which the tape is formed of barium strontium titanate.

9. A method according to claim 7 in which the ceramic material of the tape extending out of the interstices beyond the outer distal portions of the photoresist walls is removed prior to firing.

10. A method according to claim 1 in which the photoresist walls are at least 0.25 mils in height.

11. A method according to claim 1 in which the second ceramic material is barium strontium titanate.

12. A method according to claim 1 in which the ceramic substrate is barium strontium titanate.

13. A method according to claim 2 in which the second ceramic material is barium strontium titanate.

14. A method according to claim 13 in which the ceramic substrate is barium strontium titanate.

15. A method according to claim 1 in which the steps of filling the interstices, leveling the pattern, forming the pad, placing the pad over the filled pattern, and pressing the pad into the interstices are repeated one or more times prior to the firing step.

16. A method according to claim 1 in which the deformable pressing pad has an area at least as large as that of the negative image array pattern.

17. A method for making an array of pixels from ceramic material comprising the steps of
   forming a negative image array pattern of photoresist material on a substrate, the pattern having a plurality of interstices spaced from one another by walls of photoresist material extending from the substrate to an outer distal portion,
   forming a tape of deformable ceramic material using binders and solvents for tape casting,
   placing the tape over the pattern and pressing the tape into the interstices to form a pixel array in the tape,
   removing the tape from the negative image array pattern, and
   firing the tape to form a sintered array of pixels.

18. A method according to claim 17 in which the tape is formed of barium strontium titanate.

* * * * *